(12) United States Patent
Oryoji et al.

(10) Patent No.: US 8,546,949 B2
(45) Date of Patent: Oct. 1, 2013

(54) SEMICONDUCTOR DEVICE HAVING WIRINGS FORMED BY DAMASCENE

(75) Inventors: Michio Oryoji, Kawasaki (JP); Hisaya Sakai, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 154 days.

(21) Appl. No.: 12/755,656

(22) Filed: Apr. 7, 2010

(65) Prior Publication Data

US 2010/0193965 A1 Aug. 5, 2010

Related U.S. Application Data

(62) Division of application No. 11/515,202, filed on Sep. 5, 2006, now Pat. No. 7,906,433.

(30) Foreign Application Priority Data

Mar. 20, 2006 (JP) ................................. 2006-076422

(51) Int. Cl.
*H01L 23/48* (2006.01)

(52) U.S. Cl.
USPC ................................... 257/774; 257/E23.011

(58) Field of Classification Search
USPC .................. 438/695, 696, 694; 257/E21.169
See application file for complete search history.

(56) References Cited

U.S. PATENT DOCUMENTS

| | | | |
|---|---|---|---|
| 5,933,756 A | 8/1999 | Fuse | |
| 6,042,999 A | 3/2000 | Lin | |
| 6,169,030 B1 | 1/2001 | Naik | |
| 6,300,683 B1 | 10/2001 | Nagasaka | |
| 6,406,995 B1 | 6/2002 | Hussein | |
| 6,514,856 B2 | 2/2003 | Matsumoto | |
| 6,755,945 B2 | 6/2004 | Yasar et al. | |
| 6,787,454 B1 | 9/2004 | Saito | |
| 6,812,133 B2 | 11/2004 | Takeuchi | |

(Continued)

FOREIGN PATENT DOCUMENTS

| | | |
|---|---|---|
| CN | 1495879 | 5/2004 |
| CN | 1523657 | 8/2004 |

(Continued)

OTHER PUBLICATIONS

SIPO, Office Action mailed by the State Intellectual Property Office of the People's Republic of China in connection with CN patent application No. 200610138989, on Feb. 20, 2009. English-language translation provided.

SIPO, Office Action mailed by the State Intellectual Property Office of the People's Republic of China in connection with CN patent application No. 200610138989, on Oct. 16, 2009. English-language translation provided.

(Continued)

*Primary Examiner* — Seahvosh Nikmanesh
(74) *Attorney, Agent, or Firm* — Fujitsu Patent Center

(57) ABSTRACT

An insulating film is formed over a semiconductor substrate. A wiring trench formed in the insulating film reaches partway in a thickness direction of the insulating film. A via hole is disposed at an end of the wiring trench. A barrier metal film covers inner surfaces of the wiring trench and via hole. A bottom of the wiring trench and a sidewall of the via hole are connected via an inclined plane. A length of a portion of the inclined plane having an inclination angle range of 40° to 50° relative to a surface of the semiconductor substrate is equal to or shorter than a maximum size of a plan shape of the via hole, in a cross section which is parallel to a longitudinal direction of the wiring trench, passes a center of the via hole and perpendicular to the surface of the semiconductor surface.

10 Claims, 12 Drawing Sheets

(56) References Cited

U.S. PATENT DOCUMENTS

| | | |
|---|---|---|
| 6,831,368 B2 | 12/2004 | Iijima |
| 6,855,629 B2 | 2/2005 | Kim |
| 6,982,200 B2 | 1/2006 | Noguchi |
| 7,071,096 B2 | 7/2006 | Friedemann |
| 7,094,688 B2 | 8/2006 | Oryoji |
| 7,183,195 B2 | 2/2007 | Lee |
| 2002/0008323 A1 | 1/2002 | Watanabe |
| 2003/0157806 A1 | 8/2003 | Nagahara |
| 2004/0132291 A1 | 7/2004 | Lee |
| 2004/0209458 A1 | 10/2004 | Tsai |
| 2004/0238964 A1 | 12/2004 | Kawano et al. |
| 2005/0260856 A1 | 11/2005 | Kim |
| 2006/0121721 A1 | 6/2006 | Lee |
| 2006/0134909 A1 | 6/2006 | Nagase et al. |

FOREIGN PATENT DOCUMENTS

| | | |
|---|---|---|
| CN | 1812074 | 8/2006 |
| JP | 2000-208620 A | 7/2000 |
| JP | 2001230317 A | 8/2001 |
| JP | 2001-284449 | 10/2001 |
| JP | 2003-92349 | 3/2003 |
| JP | 2003-218114 A | 7/2003 |
| JP | 2004-040019 | 2/2004 |
| JP | 2004-165336 | 6/2004 |
| JP | 2004-526868 | 9/2004 |
| JP | 2004-356521 A | 12/2004 |
| JP | 2005-191254 A | 7/2005 |
| WO | WO 02-091461 | 11/2002 |

OTHER PUBLICATIONS

TIPO, Office Action mailed by the Taiwan Intellectual Property Bureau (Taiwan Patent Office) in connection with TW patent application No. 95131565, mailed Jan. 6, 2009. English-language translation provided.

USPTO, [Nikmanesh] "U.S. Appl. No. 11/515,202 (120 parent)", Final Rejection mailed Feb. 6, 2009.

USPTO, [Nikmanesh] "U.S. Appl. No. 11/515,202 (120 parent)", Restriction Requirement mailed Mar. 25, 2008.

USPTO, [Nikmanesh] "U.S. Appl. No. 11/515,202 (120 parent)", Non-Final Rejection mailed Jul. 7, 2008.

USPTO, [Nikmanesh] "U.S. Appl. No. 11/515,202 (120 parent)", Non-Final Rejection mailed Aug. 19, 2009.

U.S. Appl. No. 11/515,202, filed Sep. 5, 2006, Nikmanesh, Seahvosh.

"Japanese Office Action" mailed by JPO and corresponding to Japanese application No. 2006-076422 on Apr. 20, 2010, with Partial English translation.

Notice of Allowance, Examiner's Amendment, Examiner's Statement of Reasons for Allowance issued in parent U.S. Appl. No. 11/515,202 on Jan. 13, 2010.

USPTO, (Nikmanesh) Restriction/Election Requirement, Mar. 25, 2008, in parent (section 120 priority) U.S. Appl. No. 11/515,202 [pending].

JPO—Japan Patent Office, Official Action mailed Oct. 5, 2010, in connection with correspondent JP patent application No. 2006-076422.

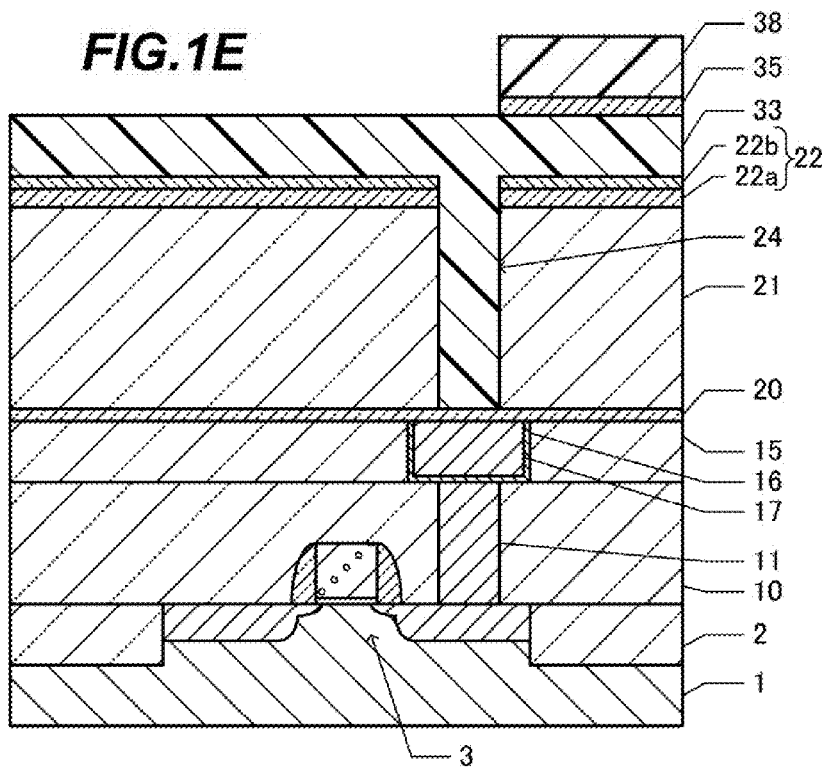
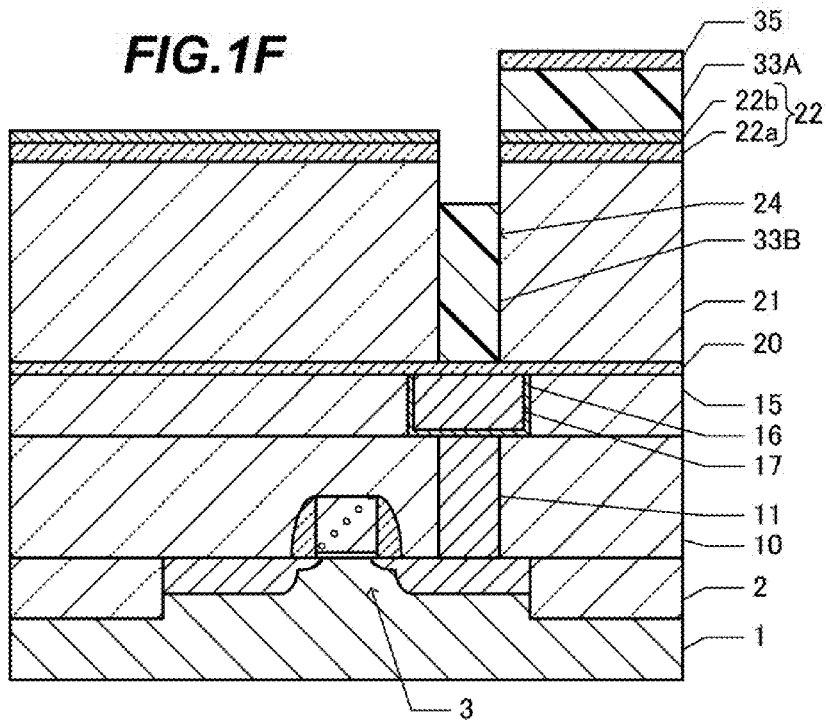

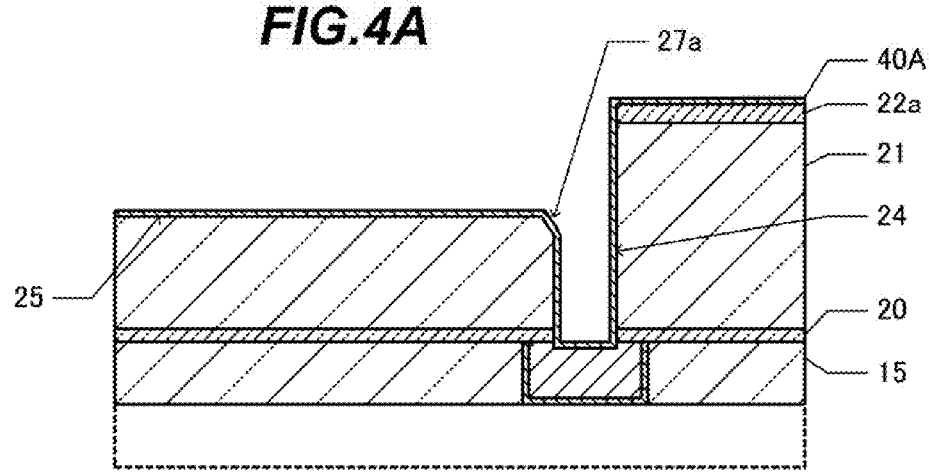
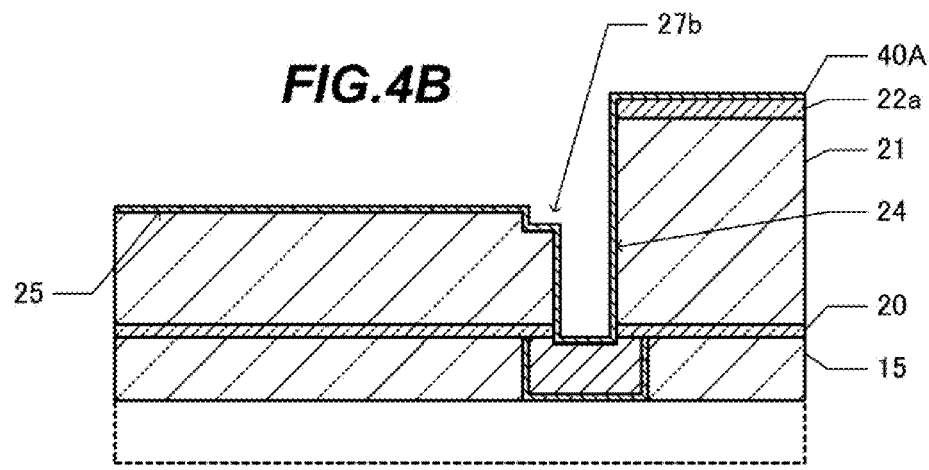
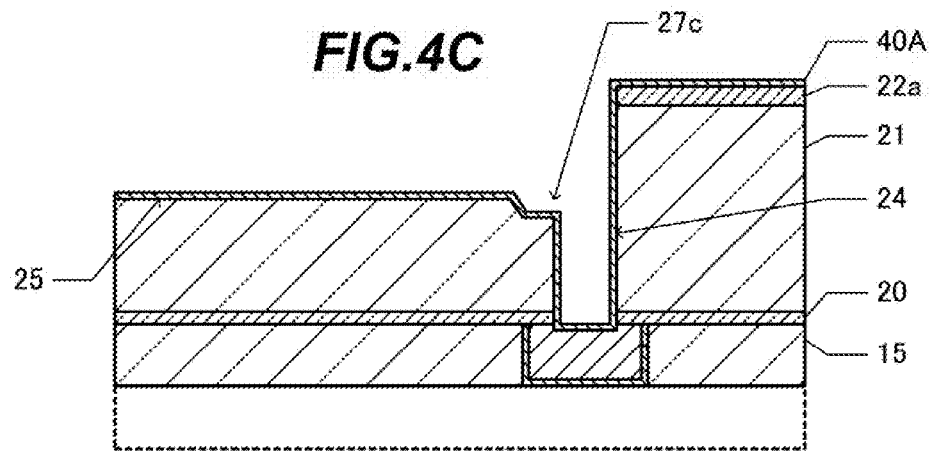

SEMICONDUCTOR DEVICE HAVING WIRINGS FORMED BY DAMASCENE

CROSS REFERENCE TO RELATED APPLICATION

This application is a divisional application of currently-pending parent application Ser. No. 11/515,202, filed Sep. 5, 2006, which is based upon and claims the benefits of priority of Japanese Patent Application No. 2006-076422 filed on Mar. 20, 2006. The entire contents of the aforementioned parent and Japanese priority applications are incorporated herein by reference.

BACKGROUND OF THE INVENTION

1. Field of the Invention

The present invention relates to a semiconductor device having wirings formed by damascene.

2. Description of the Related Art

Material having a dielectric constant lower than that of silicon oxide and the like is used as the material of an interlayer insulating film of a wiring layer in order to reduce parasitic capacitance. In order to further lower a dielectric constant, a structure is being adopted which does not use an etching stopper film having a relatively high dielectric constant. When wirings are formed by dual damascene, if an etching stopper is omitted between a via hole layer and a wiring trench layer, it becomes difficult to control the shapes of a wiring trench and a via hole.

As via holes and wiring trenches become finer, it becomes difficult to fill via holes and wiring trenches with conductive material at good reproductivity. JP-A-2003-92349 (FIG. 9) discloses a technique of improving filling characteristics by forming an inclined plane on upper edge portions of sidewalls of a via hole and a wiring trench.

JP-A-2001-284449 discloses a technique of depositing a barrier metal film on sidewalls of a via hole and a wiring trench while a barrier metal layer deposited on the bottom of the via hole is sputtered. This technique improves resistance against electromigration of wirings.

JP-A-2004-165336 discloses a method of covering an inner surface of a via hole with a barrier metal film, etching and removing the barrier metal film on the bottoms and depositing again a barrier metal film on the thinned barrier metal film on the inner surfaces other than the bottoms. This method can thin the barrier metal film on the via hole bottom and retain a sufficient thickness of the barrier metal film on the sidewall of the via hole and on the inner surface of a wiring trench.

In a barrier metal film depositing process, yield and wiring reliability can be improved by adopting sputtering combining depositing and etching. It has been found that during sputter-etching of a barrier metal film, the barrier metal film deposited on an inclined plane having an inclination angle of about 45° relative to a substrate surface is etched faster than the barrier metal film deposited on other surfaces. This may be ascribed to that an etching rate becomes maximum at an incidence angle of about 45° of sputtering ions.

If the inner surfaces of a via hole and a wiring trench have an inclined plane having an inclination angle of 45°, the barrier metal film deposited on this inclined plane is thinned. Voids or the like are formed in the via hole and wiring reliability is lowered. If a barrier metal film is again deposited on the thinned barrier metal film by using the method disclosed in JP-2004-165336, the barrier metal layer in other areas becomes too thick.

SUMMARY OF THE INVENTION

An object of the present invention is to provide a semiconductor device having a structure capable of suppressing wiring reliability from being lowered, even if a barrier metal film is sputter-etched.

According to one aspect of the present invention, there is provided a semiconductor device comprising:
  an interlayer insulating film formed over a semiconductor substrate;
  a wiring trench having a depth extending from an upper surface of the interlayer insulating film and reaching partway in a thickness direction of the interlayer insulating film;
  a via hole disposed at an end of the wiring trench and reaching a bottom of the interlayer insulating film;
  a barrier metal film covering inner surfaces of the wiring trench and the via hole; and
  a wiring filling an inside of the wiring trench and the via hole,
  wherein a bottom of the wiring trench and a sidewall of the via hole are connected via an inclined plane, and a length of a portion of the inclined plane having an inclination angle range of 40° to 50° relative to a surface of the semiconductor substrate is equal to or shorter than a maximum size of a plan shape of the via hole, in a cross section which is parallel to a longitudinal direction of the wiring trench, passes a center of the via hole and perpendicular to the surface of the semiconductor surface.

According to another aspect of the present invention, there is provided a semiconductor device comprising:
  an interlayer insulating film formed over a semiconductor substrate;
  a wiring trench having a depth extending from an upper surface of the interlayer insulating film and reaching partway in a thickness direction of the interlayer insulating film;
  a via hole disposed at an end of the wiring trench and reaching a bottom of the interlayer insulating film;
  a barrier metal film covering inner surfaces of the wiring trench and the via hole; and
  a wiring filling an inside of the wiring trench and the via hole,
  wherein a bottom of the wiring trench and a sidewall of the via hole are connected via a stepped plane.

BRIEF DESCRIPTION OF THE DRAWINGS

FIGS. 1B to 1K are cross sectional views illustrating the semiconductor device during manufacture according to an embodiment.

FIGS. 4A to 4C are cross sectional views showing examples of the shape of a connection portion between the bottom of a wiring trench and the sidewall of a via hole of a semiconductor device according to an embodiment.

DESCRIPTION OF THE PREFERRED EMBODIMENTS

Figure 1A:
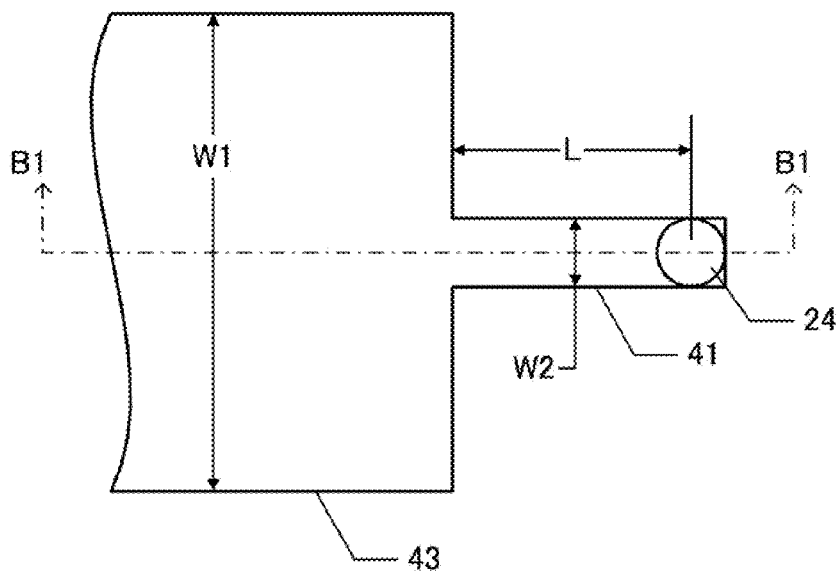
FIG. 1A is a plan view of the layout of a wiring trench and a via hole of a semiconductor device according to an embodiment.

FIG. 1A is a plan view showing a wiring and a via hole of a semiconductor device according to the embodiment. A relatively thin wiring 41 extends from an approximately center area of the edge at the end of a relatively bold wiring 43 along a direction parallel to a longitudinal direction of the bold wiring 43. A via hole 24 having a plan shape of generally a circle is disposed at the distal end of the thin wiring 41. For example, a width W1 of the bold wiring 43 is 3 μm, a width W2 of the thin wiring 41 is 140 nm, and a distance L from the end of the bold wiring 43 to the center of the via hole 24 is 1 μm. The diameter of the via hole 24 is equal to the width of the thin wiring 41.

With reference to FIGS. 1B to 1L, description will be made on a semiconductor device manufacture method according to the embodiment. FIGS. 1B to 1L correspond to cross sectional views taken along one-dot chain line B1-B1 shown in FIG. 1A. Specifically, FIGS. 1B to 1L correspond to cross sections which are parallel to the longitudinal direction of the wirings 41 and 43, pass through the center of the via hole 24, and are perpendicular to the surface of the semiconductor substrate.

Figure 1B:
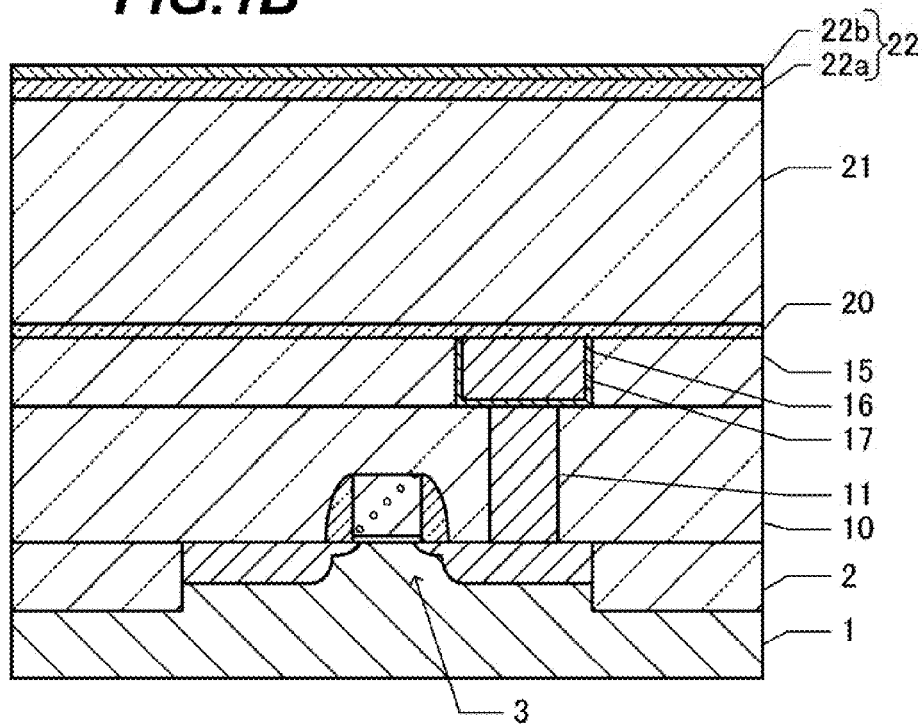

As shown in FIG. 1B, an isolation insulating film 2 having a shallow trench isolation (STI) structure is formed in the surface layer of a semiconductor substrate 1 made of silicon or the like. A MOS transistor 3 is formed in an active region surrounded by the isolation insulating film 2. An interlayer insulating film 10 made of silicon oxide or the like is formed on the semiconductor substrate 1, covering the MOS transistor 3. A conductive plug 11 made of tungsten or the like fills a via hole passing through the interlayer insulating film 10. The conductive plug 11 is connected to the source or drain of the MOS transistor 3.

An interlayer insulating film 15 made of SiOC or the like is further formed on the interlayer insulating film 10. A wiring trench is formed in the interlayer insulating film 15 by single damascene, and a wiring 17 made of Cu or the like fills the wiring trench. The inner surface of the wiring trench is covered with a barrier metal film 16 of Ta or the like.

A cap film 20 made of SiC or the like and having a thickness of 50 nm is formed on the interlayer insulating film 15. An interlayer insulating film 21 made of SiOC or the like and having a thickness of 450 nm and a first hard mask 22 are deposited on the cap film 20 in this order. The first hard mask 22 has a two-layer structure of a lower layer 22a made of $SiO_2$ and having a thickness of 100 nm and an upper layer 22b made of SiN and having a thickness of 30 nm. These films are deposited, for example, by chemical vapor deposition (CVD). In forming the lower layer 22a of the first hard mask 22, tetraetoxyorthosilicated (TEOS) and oxygen are used as source gases. Other materials having different etching resistance from that of the interlayer insulating film 21 may be used as the material of the first hard mask 22.

Figure 1C:
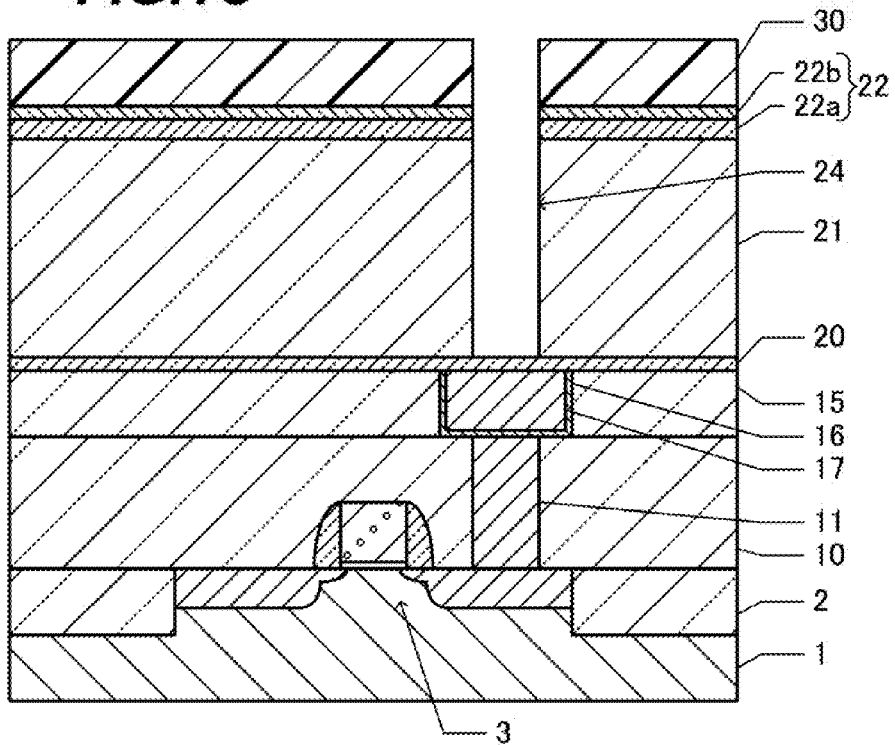

As shown in FIG. 1C, a resist pattern 30 is formed on the first hard mask 22. The resist pattern 30 has an opening corresponding to a via hole 24 to be formed in the interlayer insulating film 21. By using the resist pattern 30 as an etching mask, the first hard mask 22 and interlayer insulating film 21 are etched to form a via hole 24. The cap film 20 is exposed on the bottom of the via hole 24. This etching may be performed by using a magnetically enhanced reactive ion etching (MERIE) system under the following conditions:

| | |
|---|---|
| $C_4F_6$ flow rate | 6 sccm; |
| $O_2$ flow rate | 6 sccm; |
| $N_2$ flow rate | 60 sccm; |
| Ar flow rate | 600 sccm; |
| Pressure | 6.7 Pa (50 mTorr); |
| RF power | 1200 W. |

After the via hole 24 is formed, the resist pattern 30 is removed.

Figure 1D:
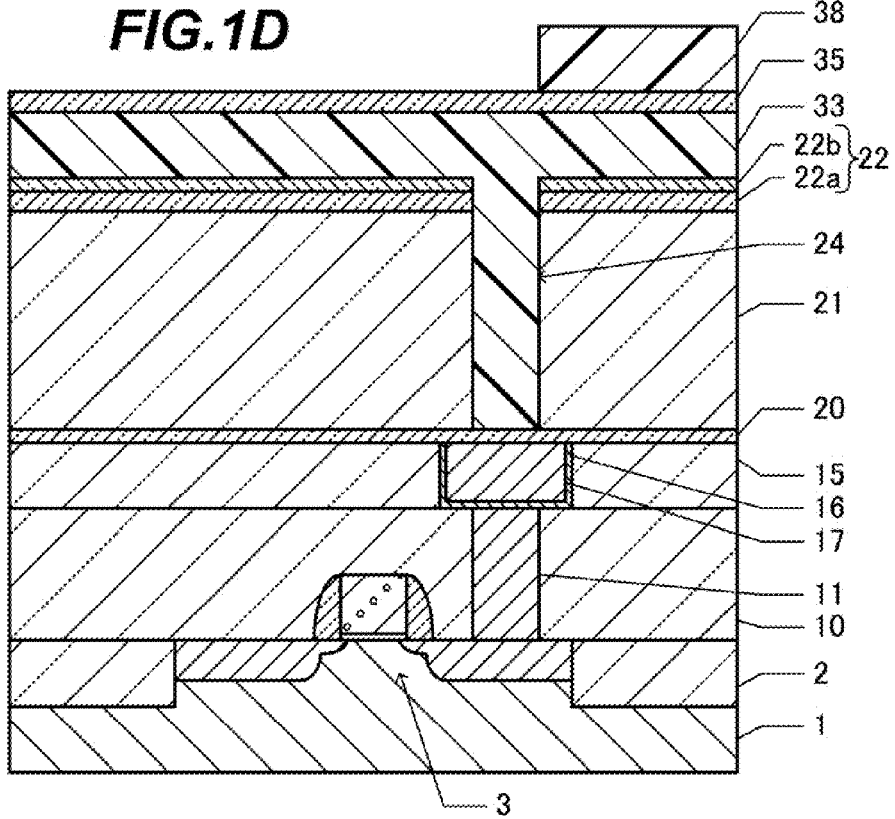

As shown in FIG. 1D, a filling member 33 made of resist not having photosensitivity is formed on the first hard mask 22. The filling member 33 also fills the via hole 24. The surface of the filling member 33 is generally flat. Other materials having different etching resistance from those of the cap film 20, interlayer insulating film 21 and first hard mask 22 may be used as the material of the filling member 33.

A second hard mask 35 made of $SiO_2$ and having a thickness of 100 nm is formed on the flat surface of the filling member 33 by CVD using TEOS as source gas. Other materials having different etching resistance from that of the filling member 33 may be used as the material of the second hard mask 35. A resist pattern 38 is formed on the second hard mask 35. The resist pattern 38 has an opening corresponding to a wiring trench to be formed in the interlayer insulating film 21.

As shown in FIG. 1E, by using the resist pattern 38 as an etching mask, the second hard mask 35 is etched by using the MERIE system. The etching conditions are as follow:

| | |
|---|---|
| $C_4F_6$ flow rate | 25 sccm; |
| $O_2$ flow rate | 50 sccm; |
| Ar flow rate | 250 sccm; |
| Pressure | 3.3 Pa (25 mTorr); |
| RF power | 250 W. |

As shown in FIG. 1F, by using the second hard mask 35 as an etching mask, the filling member 33 is etched to an intermediate depth of the via hole 24. The etching conditions are as follow:

| | |
|---|---|
| $O_2$ flow rate | 10 sccm; |
| $N_2$ flow rate | 300 sccm; |

| | |
|---|---|
| Pressure | 6.7 Pa (50 mTorr); |
| RF power | 200 W. |

With this etching, the resist pattern 38 covering the second hard mask 35 is also removed, so that the upper surface of the second hard mask 35 is exposed. The upper surface of the first hard mask 22 in the area corresponding to the wiring trench is exposed. A portion 33A of the filling member is left in the region covered with the second hard mask 35, and a portion 33B of the filling member is left in a partial region of the via hole 24. A preferred height of the filling member 33B to be left in the via hole 24 will be later described in detail.

Figure 1G:
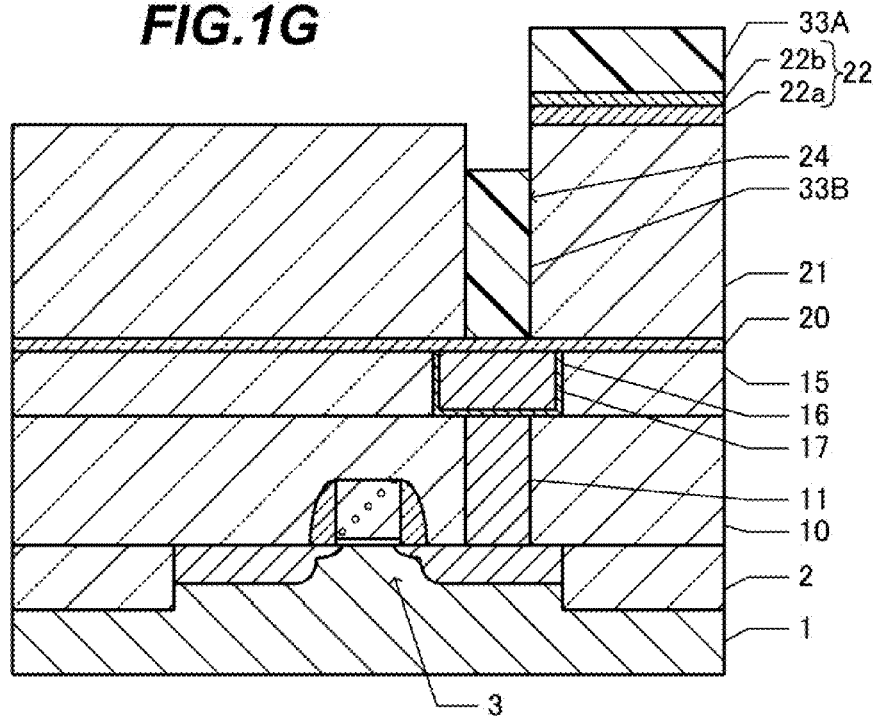

As shown in FIG. 1G, by using the filling member 33A as an etching mask, the first hard mask 22 is etched by using the MERIE system. The etching conditions are as follow:

| | |
|---|---|
| $CF_4$ flow rate | 50 sccm; |
| $CHF_3$ flow rate | 50 sccm; |
| Pressure | 3.3 Pa (25 mTorr); |
| RF power | 500 W. |

This etching exposes the surface of the interlayer insulating film 21 in the area corresponding to the wiring trench. The second hard mask 35 left on the filling member 33A is also removed.

Figure 1H:
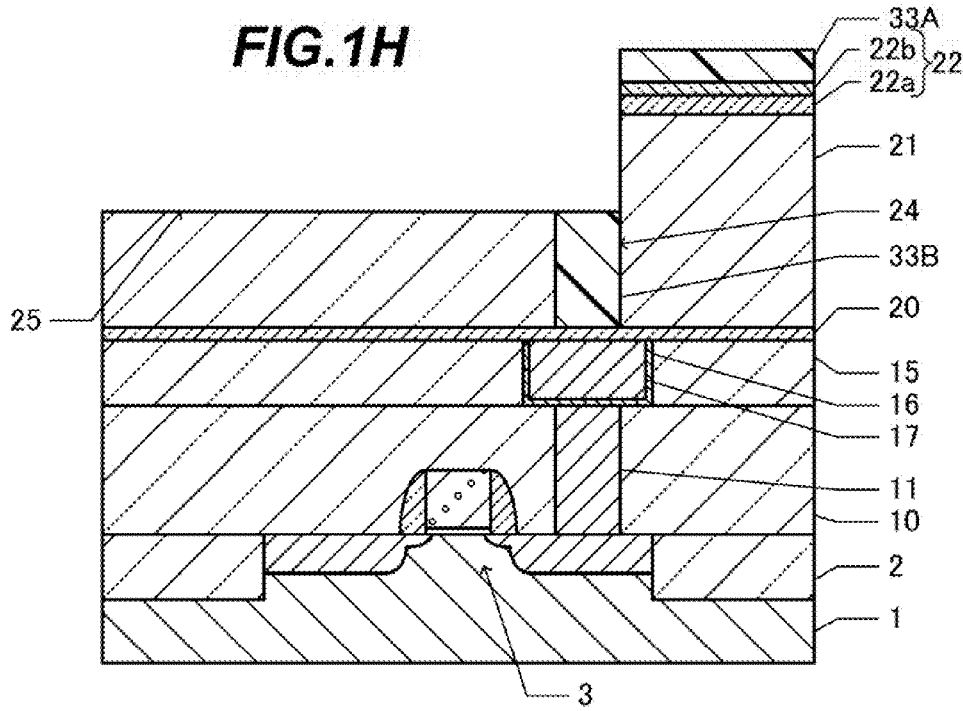

As shown in FIG. 1H, by using the filling members 33A and 33B as an etching mask, the interlayer insulating film 21 is etched partway in the thickness direction by using the MERIE system, under the condition that an etching rate of the interlayer insulating film 21 is faster than that of the filling member 33B. The specific etching conditions are as follows:

| | |
|---|---|
| $CF_4$ flow rate | 70 sccm; |
| $CHF_3$ flow rate | 30 sccm; |
| Pressure | 3.3 Pa (25 mTorr); |
| RF power | 500 W. |

This etching forms a wiring trench 25. Since the filling members 33A and 33B are partially etched while the interlayer insulating film 21 is etched, the filling member 33A left on the first hard mask 22 is thinned and the filling member 33B filling the via hole 24 becomes short in height. It is preferable that the bottom of the wiring trench 25 is generally on the same level as the upper surface of the filling member 33B filling the via hole 24, at the time when the wiring trench 25 is etched to a target depth. More specifically, it is preferable that a height difference between the upper surface of the filling member 33B left in the via hole 24 and the bottom of the wiring trench 25 is half or less than half the maximum size of the plan shape of the via hole 24. To this end, a height of the filling member 33B to be left in the via hole 24 in the process shown in FIG. 1G is adjusted based on a target depth of the wiring trench 25 to be formed and a ratio between the etching rate of the interlayer insulating film 21 and the etching rate of the filling member 33B.

After the wiring trench 25 is formed, the filling members 33A and 33B are removed by ashing. The ashing conditions are as follows:

| | |
|---|---|
| $O_2$ flow rate | 900 sccm; |
| Pressure | 40 Pa (300 mTorr); |
| RF power | 300 W. |

Figure 1I:
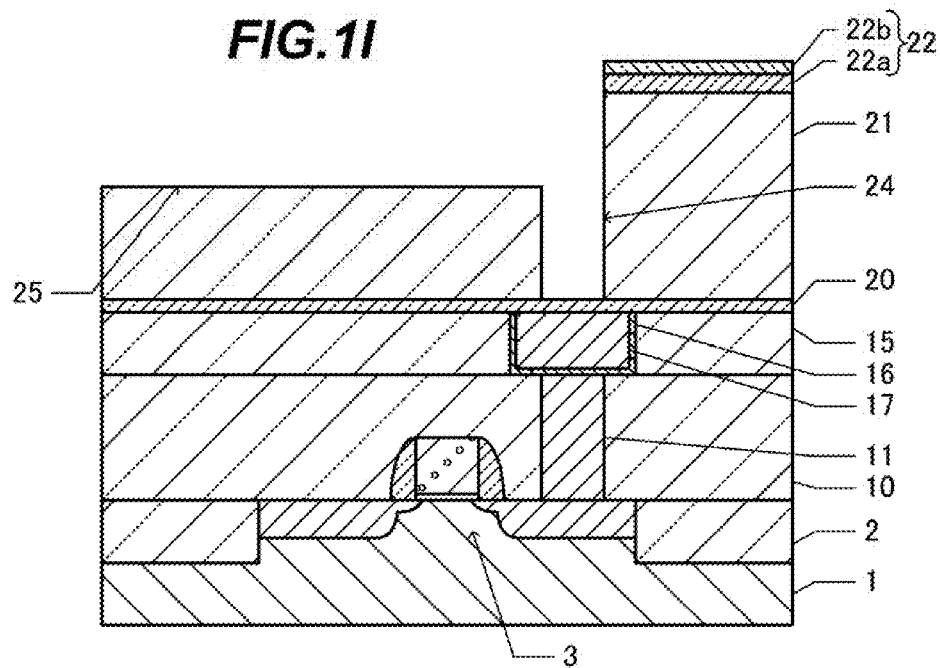

As shown in FIG. 1I, the cap film 20 is exposed on the bottom of the via hole 24, and the upper surface of the first hard mask 22 is exposed.

Figure 1J:
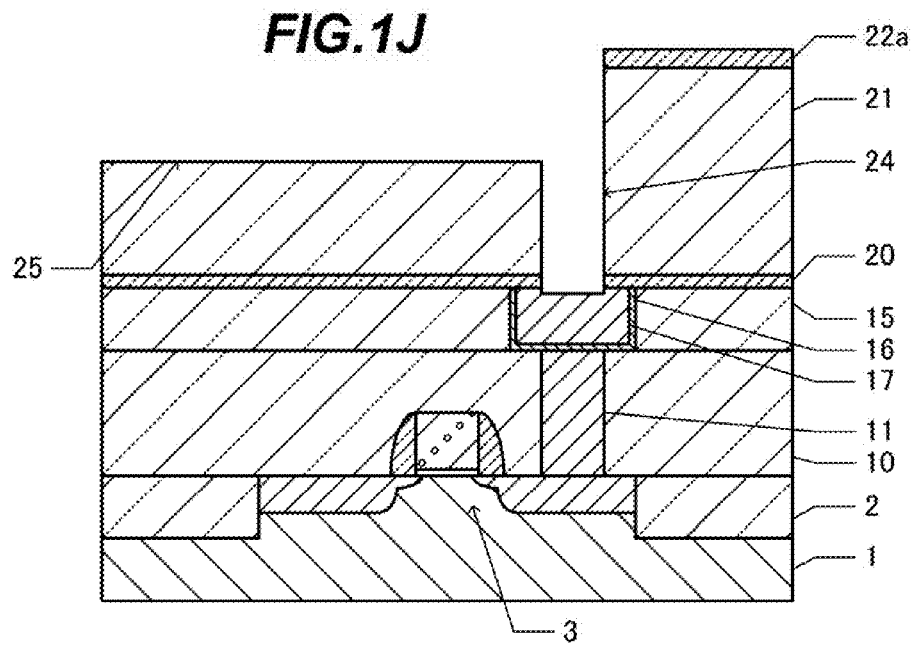

As shown in FIG. 1J, the cap film 20 exposed on the bottom of the via hole 24 is etched by using the MERIE system. The etching conditions are as follows:

| | |
|---|---|
| $CH_2F_2$ flow rate | 20 sccm; |
| $O_2$ flow rate | 10 sccm; |
| $N_2$ flow rate | 50 sccm; |
| Pressure | 2.7 Pa (20 mTorr); |
| RF power | 100 W. |

While the cap film 20 is etched, the upper layer 22b of the first hard mask 22 is removed. The surface of the Cu wiring 17 exposed on the bottom of the via hole 24 is cleaned by sputtering using Ar or the like.

Figure 1K:
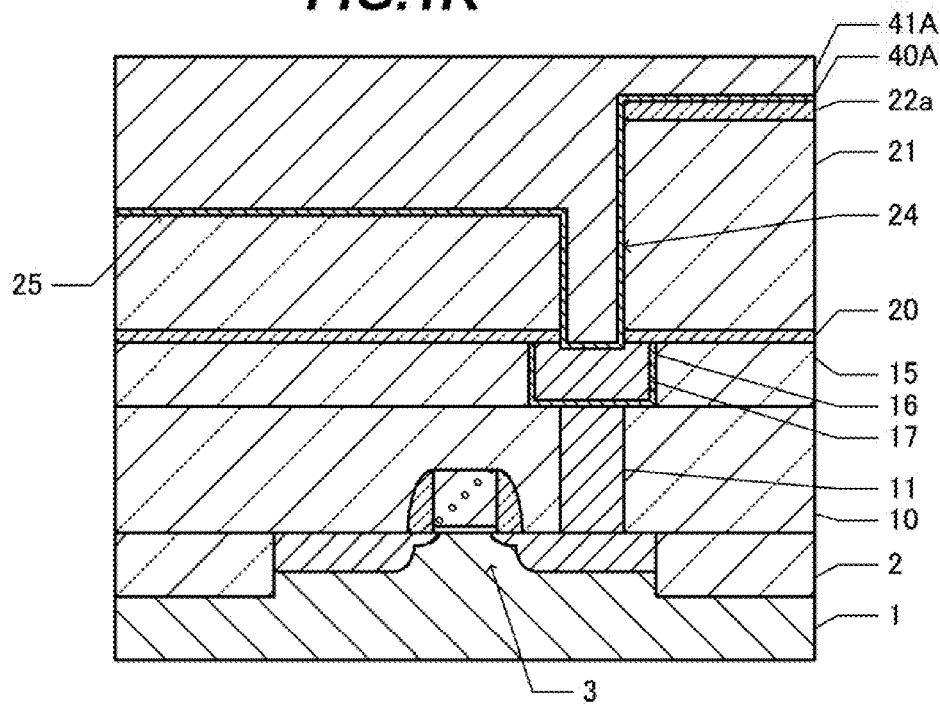

As shown in FIG. 1K, a barrier metal film 40A of Ta or the like is formed by sputtering, covering the inner surface of the wiring trench 25, the inner surface of the via hole 24 and the upper surface of the lower layer 22a of the first hard mask 22.

Figure 2:
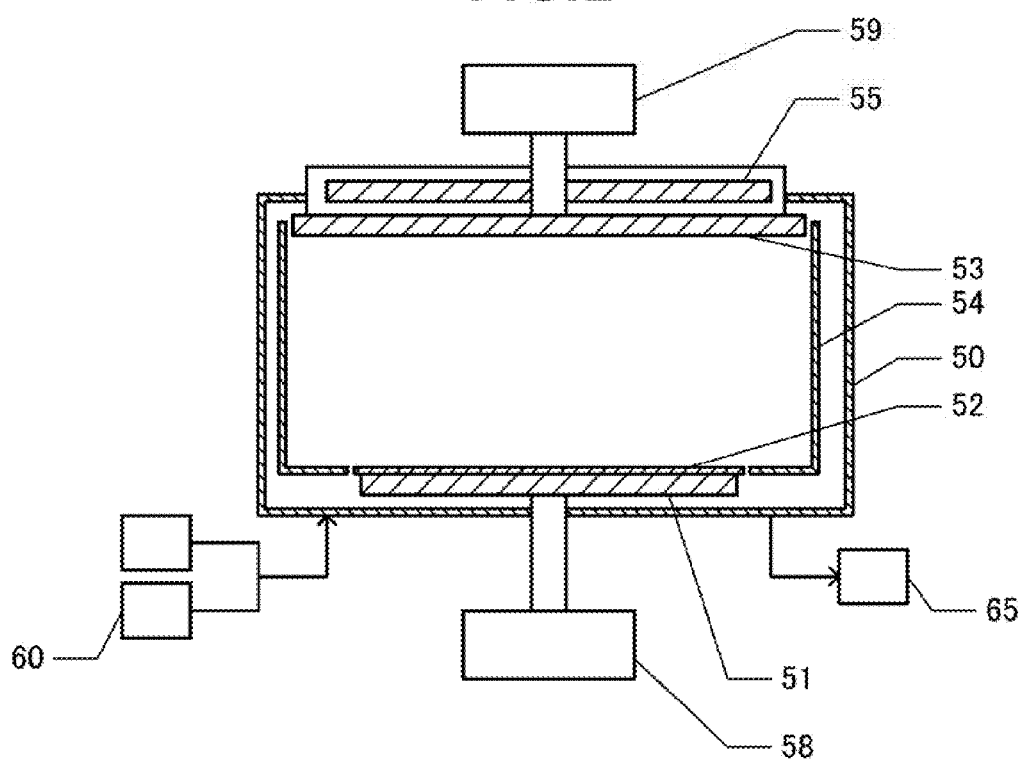
FIG. 2 is a cross sectional view of a sputtering system for forming a barrier metal film.

FIG. 2 is a schematic cross sectional view of a sputtering system. A wafer stage 51 is disposed in a chamber 50, and a wafer 52 is held on the wafer stage 51. A target 53 is held above the wafer 52. The sides of a space between the target 53 and wafer stage 51 are magnetically shielded by shields 54. A rotary magnetic assembler 55 is mounted on the target 53.

A stage bias power source 58 supplies a substrate bias power to the wafer stage 51. A target power source 59 supplies a target power to the target 53. The substrate bias power and target power are, for example, RF power at a frequency of 13.56 MHz. Gas is supplied into the chamber 50 from a gas supply source 60, and a vacuum pump 65 evacuates the inside of the chamber 50. By controlling the target power and substrate bias power, it is possible to adjust a depositing rate and etching rates of the Ta film.

In the following, description will be made on a method of forming the barrier metal film 40A made of Ta. First, a Ta film is deposited under the condition that the depositing rate is faster than the etching rate. The film forming conditions are as follows:

| | |
|---|---|
| Target power | 10 kW; |
| Substrate bias power | 0 to 200 W; |
| Pressure | $4 \times 10^{-2}$ to $8 \times 10^{-2}$ Pa. |

Next, the Ta film deposited on the substrate is re-sputtered under the condition that the etching rate is faster than the depositing rate, e.g., the depositing rate is about 0.5 to 0.9 time as fast as the etching rate. The re-sputtering conditions are as follows:

| | |
|---|---|
| Target power | 0.5 to 4.0 kW; |
| Substrate bias power | 200 to 600 W; |
| Pressure | $4 \times 10^{-2}$ to $8 \times 10^{-2}$ Pa; |
| Re-sputtering time | 5 to 30 sec. |

A thickness of the barrier metal film 40A formed under the above-described conditions is 5 to 8 nm on the sidewall of the via hole 24, 3 to 5 nm on the bottom of the via hole 24, 8 to 13 nm on the sidewall of the wiring trench 25, 5 to 10 nm on the bottom of the wiring trench 25, and 10 to 15 nm on the first hard mask 22.

A Cu seed film is formed by sputtering on the barrier metal film 40A, and Cu is electroplated to form a conductive film 41A. The via hole 24 and wiring trench 25 are filled with the conductive film 41A.

Figure 1L:
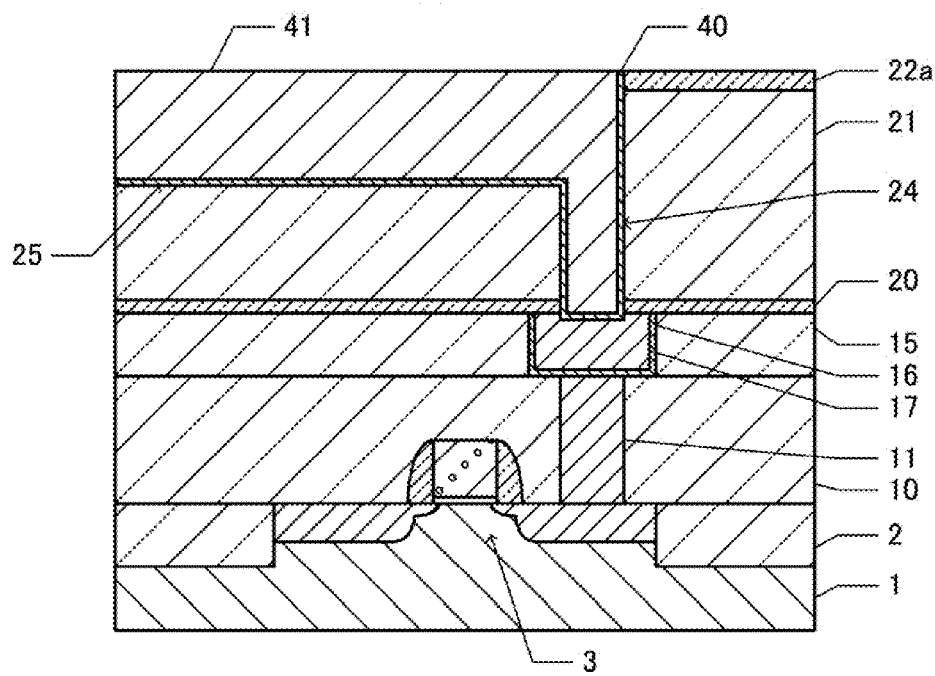
FIG. 1L is a cross sectional view of the semiconductor device of the embodiment.

As shown in FIG. 1L, CMP is performed until the lower layer 22a of the first hard mask is exposed. The barrier metal film 40 is left on the inner surfaces of the via hole 24 and wiring trench 25 to form a wiring 41 filling the via hole 24 and wiring trench 25.

Next, with reference to FIGS. 3A and 3B, description will be made on the shape of the connection portion between the bottom of the wiring trench 25 and the sidewall of the via hole 24.

Figure 3A:
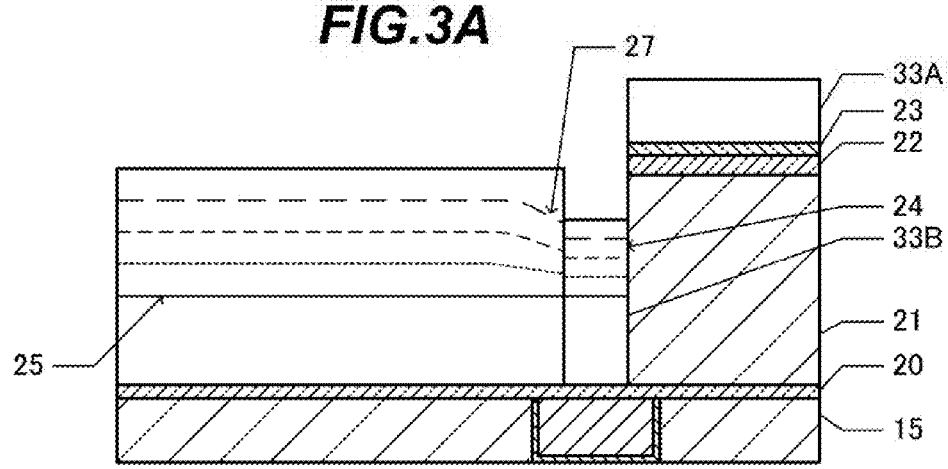
FIG. 3A is a cross sectional view illustrating intermediate etching progresses while a wiring trench is formed by a semiconductor device manufacture method according to the embodiment.
Figure 3B:
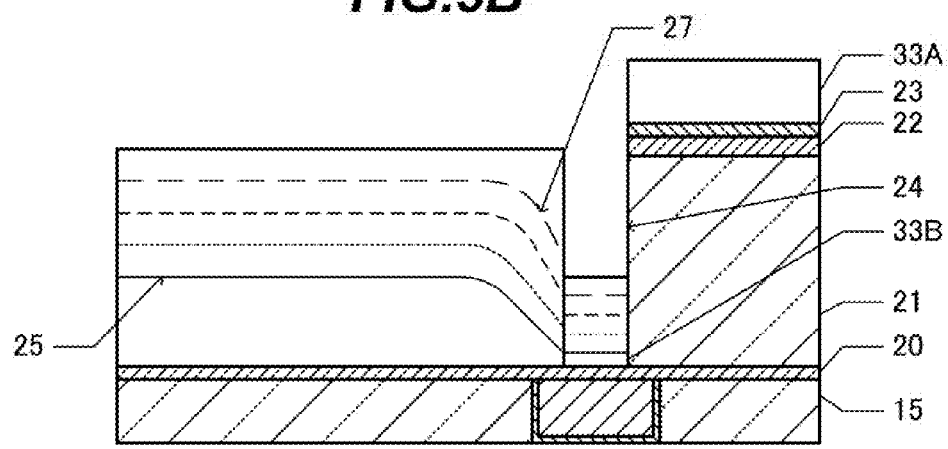
FIG. 3B is a cross sectional view illustrating intermediate etching progresses while a wiring trench is formed by a semiconductor device manufacture method according to a comparative example.

FIG. 3B illustrates etching progresses when the filling member 33B left in the via hole 24 is too short in height. At the initial etching stage, since the sidewall of the via hole 24 near at the upper end is exposed, an inclined plane 27 is formed at the connection portion between the sidewall of the via hole 24 and the bottom of the wiring trench 25. As the etching progresses for the interlayer insulating film 21 in the region where the wiring trench 25 is to be formed, the filling member 33B is also etched and it becomes short in height. As the filling member 33B becomes short in height, the exposed area of the sidewall of the via hole 24 increases and the inclined plane 27 becomes large.

FIG. 3A illustrates etching progresses while the interlayer insulating film 21 is etched by the embodiment method. Similar to that shown in FIG. 3B, at the initial etching stage, an inclined plane 27 is formed at the connection portion between the sidewall of the via hole 24 and the bottom of the wiring trench 25. However, since the exposed area of the via hole 24 is shallow, the inclined plane 27 is more gentle than that shown in FIG. 3B. As the etching progresses and the bottom of the wiring trench 25 comes up with the upper surface of the filling member 33B, the inclined plane is hard to be formed further. The inclined plane is formed less if etching is stopped when the bottom of the wiring trench 25 reaches the same level as the upper surface of the filling member 24.

Next, with reference to FIGS. 4A to 4F, description will be made on various surface shapes to be formed at the connection portion between the bottom of the wiring trench 25 and the sidewall of the via hole 24. FIGS. 4A to 4F correspond to cross sectional views taken along one-dot chain line B1-B1 shown in FIG. 1A. Specifically, FIGS. 4A to 4F correspond to cross sections which are parallel to the longitudinal direction of the wirings 41 and 43, pass through the center of the via hole 24, and are perpendicular to the surface of the semiconductor substrate.

FIG. 4A shows the state that an inclined plane 27a is formed at the connection portion between the bottom of the wiring trench 25 and the sidewall of the via hole 24. An inclination angle of the inclined plane 27a to the surface of the semiconductor substrate 1 is larger than 50°.

FIG. 4B shows the state that a stepped plane 27b is formed at the connection portion between the bottom of the wiring trench 25 and the sidewall of the via hole 24. The stepped plane 27b includes a relatively gentle gradient region continuous with the sidewall of the via hole 24 and a relatively steep gradient region continuous with the bottom of the wiring trench 25. The stepped plane shown in FIG. 4B has an inclination angle of almost 0° at the gentle gradient region and almost 90° at the steep gradient region.

A stepped plane 27c shown in FIG. 4C has a shape different from that of the stepped plane 27b shown in FIG. 4B. An inclination angle at the gentle gradient region is almost 0° and an inclination angle at the steep gradient region is larger than 50°.

Figure 4D:
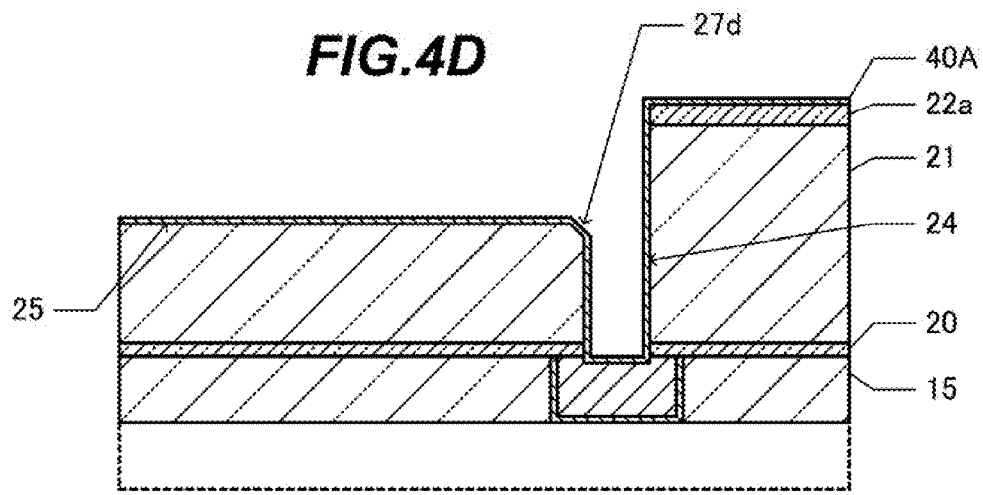
FIGS. 4D and 4E are cross sectional views showing examples of the shape of a connection portion between the bottom of a wiring trench and the sidewall of a via hole of a semiconductor device according to an embodiment.
Figure 4E:
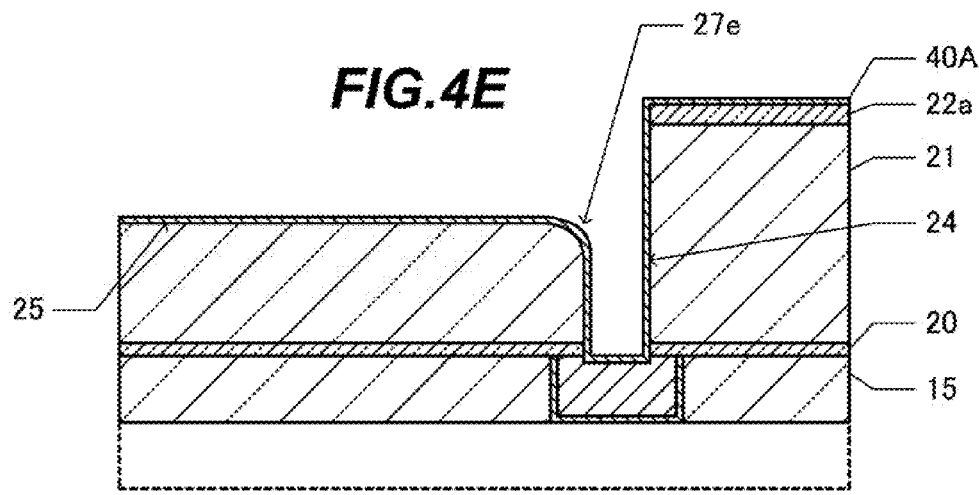
Figure 4F:
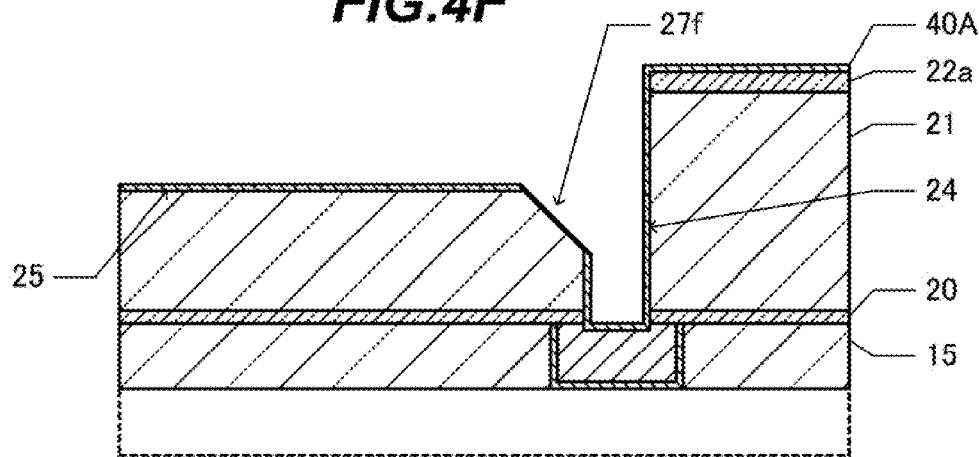
FIG. 4F is a cross sectional view showing an example of the shape of a connection portion between the bottom of a wiring trench and the sidewall of a via hole of a semiconductor device according to a comparative example.

FIG. 4D shows the state that an inclined plane 27d is formed with an inclination angle range of 40° to 50°. FIG. 4E shows the state that an inclined plane 27e is formed including a curved portion in the cross section. FIG. 4F shows the state that an inclined plane 27f is formed with an inclination angle range of 40° to 50° and is larger than the inclined plane 27d shown in FIG. 4D.

A difference between these shapes results from a difference between the etching conditions of the process of etching the interlayer insulating film 21 shown in FIG. 1H, a height difference between the bottom of the wiring trench 25 and the upper surface of the filling member 33B, and other reasons.

Figure 5A:
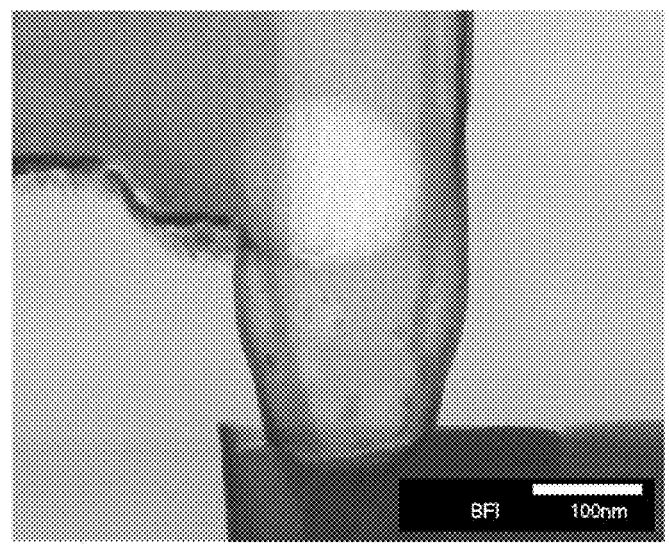
FIGS. 5A and 5B are microscopic photographs showing a wiring trench and a via hole of a semiconductor device actually manufactured.
Figure 5B:
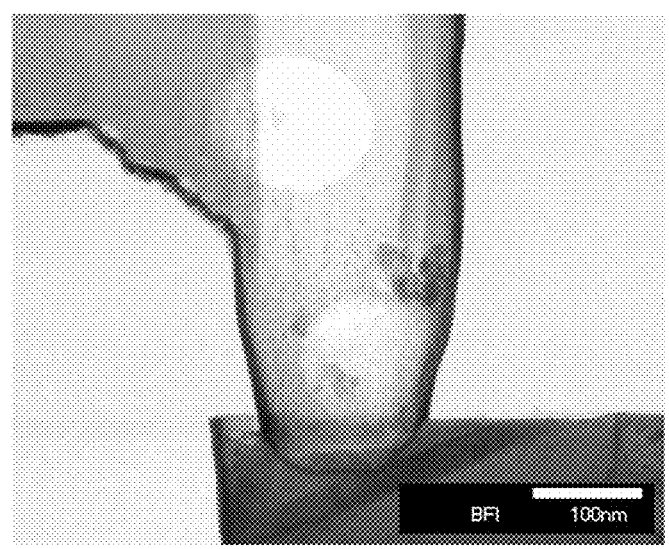

FIGS. 5A and 5B are microscopic photographs showing the cross sections of a wiring trench and a via hole actually formed. These photographs show the state that the inner surfaces of the wiring trench and via hole are covered with a barrier metal film. A Cu wiring is not still deposited. FIG. 5A corresponds to the state shown in FIG. 4C having the stepped plane at the connection portion between the bottom of the wiring trench and the sidewall of the via hole. FIG. 5B corresponds to the state shown in FIG. 4D or 4F having the inclined plane with the inclination angle range of 40° to 50° at the connection portion between the bottom of the wiring trench and the sidewall of the via hole.

In order to evaluate stress migration resistance of the samples shown in FIGS. 5A and 5B, the samples were heated to about 200° C. and kept in this condition for 21 days, and a via resistance before heating and a via resistance after leaving it at a raised temperature condition were measured.

Figure 6:
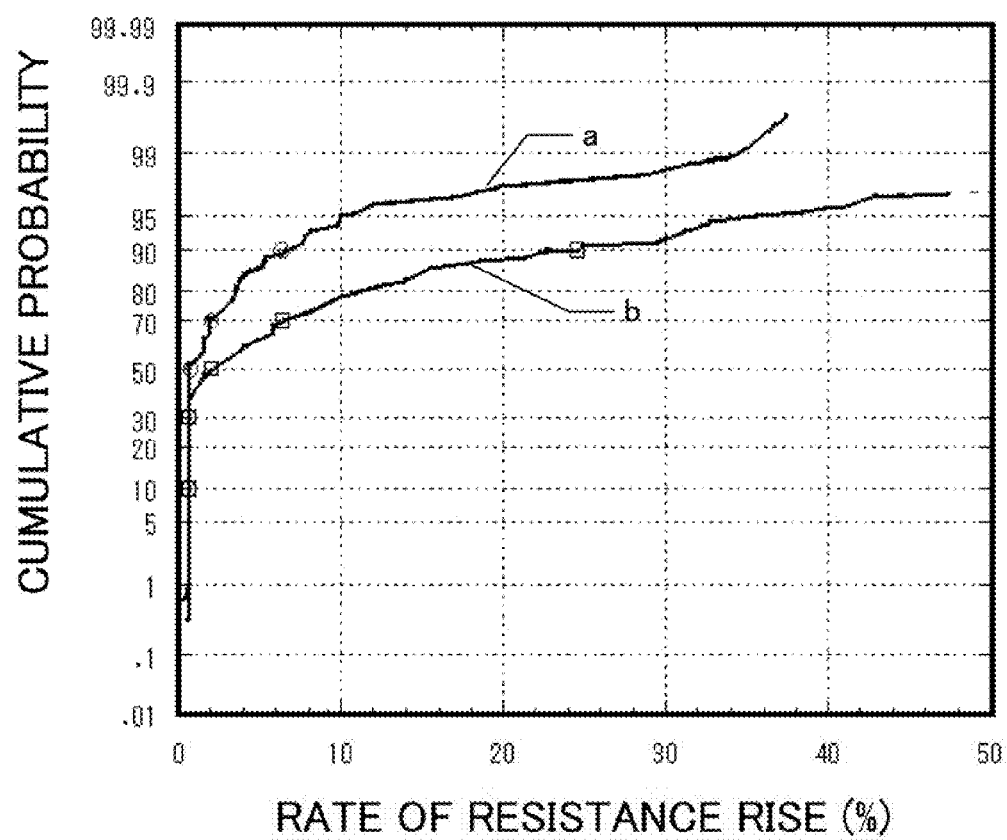
FIG. 6 is a graph showing a relation between a rate of resistance rise and a cumulative probability in a stress migration resistance evaluation test of samples corresponding to those shown in FIGS. 5A and 5B.

FIG. 6 is a graph showing a cumulative probability of a rate of resistance rise of a via chain of each sample shown in FIGS. 5A and 5B. The abscissa represents a rate of resistance rise in the unit of "%" and the ordinate represents a cumulative probability. Curves a and b shown in FIG. 6 indicate the cumulative probabilities of the samples shown in FIGS. 5A and 5B, respectively.

It can be understood that the sample shown in FIG. 5B has a higher rate of via resistance rise than that of the sample shown in FIG. 5A. After the evaluation test, the via hole of the sample shown in FIG. 5B was observed. It has been found that the via resistance rises because of voids formed in the via hole. The cause of void generation will be described below.

If the large inclined plane 27f having the inclination angle of 40° to 50° is formed as shown in FIG. 4F, the barrier metal film 40A deposited on the inclined plane 27f is thinned by re-sputtering during the process of forming the barrier metal film 40A. It can be considered that tight adhesion of the Cu wiring 41 is degraded in the region where the barrier metal film 40A was thinned and voids are likely to be generated. Film thinning amount by re-sputtering is large particularly on the inclined plane having the inclination angle of 40° to 50°.

If the inclination angle of the inclined plane 27a is larger than 50° as shown in FIG. 4A, thinning amount of the barrier metal film 40A deposited on the inclined plane 27a by re-sputtering is less. It is therefore possible to prevent wiring reliability from being lowered. It is also possible to prevent wiring reliability from being lowered even at an inclination angle of the inclined plane smaller than 40°.

If the stepped plane 27b is formed at the connection portion between the bottom of the wiring trench 25 and the sidewall of the via hole 24 as shown in FIG. 4B, it is also possible to suppress thinning of the barrier metal film 40A to be caused by re-sputtering. Thinning suppressing effects of the barrier metal film 40A are remarkable if the inclination angle at the gentle gradient region of the stepped plane 27b is smaller than 40° and the inclination angle at the steep gradient region is larger than 50°.

If the inclination angle of the inclined plane 27d is in the range of 40° to 50° as shown in FIG. 4D, there is a fear of thinning of the barrier metal film 40A deposited on the inclined plane. However, if a length of the inclined plane 27d in the cross section shown in FIG. 4D is equal to or shorter than the maximum size of the plan shape of the via hole 24, the influence of thinning of the barrier metal film 40A is less. The maximum size of the plan shape means the diameter of the smallest circle inclusive of the plan shape of the via hole. For example, if the plan shape of the via hole is a circle, the maximum size equals to the diameter, and if the plan shape is a square or a rectangle, the maximum size equals to a length of the diagonal line.

If the inclination angle of the inclined plane 27c at the steep gradient region is in the range of 40° to 50° as shown in FIG. 4C, the influence of thinning of the barrier metal film 40A is less if the length of the steep gradient region in the cross section shown in FIG. 4C is equal to or shorter than the maximum size of the plan shape of the via hole 24.

If the inclined plane 27e has a curved portion in the cross section as shown in FIG. 4E, it is preferable to set the total length of the region having the inclination angle range of 40° to 50° equal to or shorter than the maximum size of the plan shape of the via hole 24.

If the inclined plane 27f is large and the length of the inclined plane 27f in the cross section is longer than the maximum size of the plan shape of the via hole 24 as shown in FIG. 4F, stress migration resistance of a wiring is not sufficient and voids are likely to be generated.

According to the evaluation experiments made by the present inventors, it has been found that voids are likely to be generated in a via hole in the structure that a thin wiring extends from one end of a bold wiring and a via hole is disposed at the distal end of the thin wiring as shown in FIG. 1A. Therefore, the effects of adjusting the shape of the connection portion between the bottom of the wiring trench and the sidewall of the via hole so as to form the shapes described in the embodiment, are remarkable particularly for a semiconductor device having the above-described layout of a wiring pattern and a via hole.

The remarkable effects can be expected if the width of the bold wiring 43 is three or more times as large as the width of the thin wiring 41. The remarkable effects can also be expected if the length from the end of the thick wiring 43 to the center of the via hole 24 is 1.5 or more times as long as the diameter of the via hole 24.

The present invention has been described in connection with the preferred embodiments. The invention is not limited only to the above embodiments. It will be apparent to those skilled in the art that other various modifications, improvements, combinations, and the like can be made.

What we claim are:

1. A semiconductor device comprising:
   an interlayer insulating film formed over a semiconductor substrate, the interlayer insulating film being made of a single material from a bottom surface thereof to an upper surface thereof;
   a wiring trench formed in the interlayer insulating film, the wiring trench having a bottom in the interlayer insulating film, and extending in a first direction;
   a via hole formed from the bottom of the wiring trench and reaching the bottom surface of the interlayer insulating film;
   a barrier metal film covering inner surfaces of the wiring trench and the via hole; and
   a wiring formed on the barrier metal film, and filling an inside of the wiring trench and the via hole,
   wherein the bottom of the wiring trench includes a bottom plane parallel to the upper surface of the interlayer insulating film and an inclined plane disposed between the bottom plane and a sidewall of the via hole, and a length of a first portion of the inclined plane having an inclination angle range of 40° to 50° relative to a surface of the semiconductor substrate in a cross section which is parallel to the first direction of the wiring trench, passes a center of the via hole and perpendicular to the surface of the semiconductor surface, is equal to or shorter than a maximum size of the via hole in plan view, and
   wherein the upper surface of the interlayer insulating film is located at a level higher than the bottom plane of the wiring trench.

2. The semiconductor device according to claim 1, wherein the wiring trench includes a first portion having a first width and a second portion having a second width that is smaller than the first width and extends from an end of the first portion, and the via hole is disposed at a distal end of the second portion.

3. The semiconductor device according to claim 2, wherein the first width is three or more times as wide as the second width.

4. The semiconductor device according to claim 2, wherein a length from the end of the first portion to the center of the via hole is 1.5 or more times as long as a diameter of the via hole.

5. The semiconductor device according to claim 1, wherein the inclined plane includes a second portion having an inclination angle to the surface of the semiconductor substrate, which is smaller than 40° or larger than 50°.

6. The semiconductor device according to claim 1, wherein the inclined plane includes a curved portion in the cross section parallel to the first direction of the wiring trench, passing through the center of the via hole, and perpendicular to the surface of the semiconductor substrate.

7. A semiconductor device comprising:
   an interlayer insulating film formed over a semiconductor substrate, the interlayer insulating film being made of a single material from a bottom surface thereof to an upper surface thereof;
   a wiring trench formed in the interlayer insulating film, the wiring trench having a bottom in the interlayer insulating film;
   a via hole formed from the bottom of the wiring trench and reaching the bottom surface of the interlayer insulating film;
   a barrier metal film covering inner surfaces of the wiring trench and the via hole; and
   a wiring formed on the barrier metal film, and filling an inside of the wiring trench and the via hole,
   wherein the bottom of the wiring trench includes a bottom plane parallel to the upper surface of the interlayer insulating film and a stepped plane disposed between the bottom plane and a sidewall of the via hole, and
   wherein the upper surface of the interlayer insulating film is located at a level higher than the bottom plane of the wiring trench.

8. The semiconductor device according to claim 7, wherein the stepped plane include a relatively gentle gradient region continuous with the sidewall of the via hole and a relatively steep gradient region continuous with the bottom of the wiring trench.

9. The semiconductor device according to claim 8, wherein an inclination angle of the gentle gradient region is smaller than 40° and an inclination angle of the steep gradient region is larger than 50°.

10. The semiconductor device according to claim 8, wherein an inclination angle of the steep gradient region is in a range of 40° to 50°, and a length of the steep gradient region is equal to or smaller than a maximum size of a plan shape of the via hole, in a cross section passing through the center of the via hole and being perpendicular to a surface of the semiconductor substrate.

\* \* \* \* \*